United States Patent [19]

Mon et al.

[11] Patent Number: 5,059,635
[45] Date of Patent: Oct. 22, 1991

[54] METHODS FOR REDUCING THE REACTIVITY OF ARTICLES DESTINED FOR DISPOSAL

[75] Inventors: Joseph M. Mon, Lawrenceville; James R. Petisce, Norcross, both of Ga.

[73] Assignee: AT&T Bell Laboratories, Murray Hill, N.J.

[21] Appl. No.: 366,557

[22] Filed: Jun. 15, 1989

[51] Int. Cl.$^5$ .................. C08F 2/46; C08G 85/00; C08J 3/28
[52] U.S. Cl. .................. 522/3; 250/504 R; 250/504 H
[58] Field of Search .................. 250/504 R, 504 H; 522/3

[56] References Cited

U.S. PATENT DOCUMENTS

| | | |
|---|---|---|
| 1,965,947 | 8/1931 | Prouty .................. 250/34 |
| 2,586,625 | 6/1948 | Downey .................. 240/11.4 |
| 3,970,856 | 7/1976 | Mahaffey et al. .................. 250/493 |
| 4,131,563 | 12/1978 | Bähr et al. .................. 252/301.1 W |
| 4,409,263 | 10/1983 | Aloisio, Jr. et al. .................. 427/163 |
| 4,764,305 | 8/1988 | de Tassigny .................. 252/628 |

*Primary Examiner*—Marion E. McCamish
*Assistant Examiner*—Mark A. Chapman
*Attorney, Agent, or Firm*—E. W. Somers

[57] ABSTRACT

Containers (20—20) which held UV curable acrylate materials commonly used as coating materials for drawn optical fiber are treated prior to disposal. Because of the presence of acrylate residues therewithin, the container cannot be disposed of in a landfill and has been incinerated. This problem has been overcome by exposing the residue within the container to suitable reproducible radiation determined in accordance with the photochemistry of the residue materials to cure completely the remaining acrylate material and thereby reduce its reactivity.

11 Claims, 3 Drawing Sheets

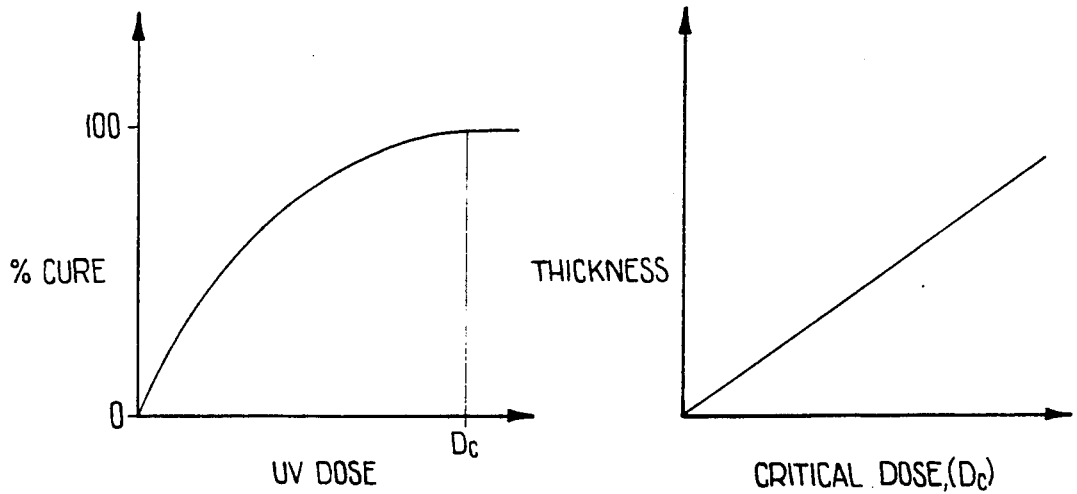
FIG 2
FIG 3
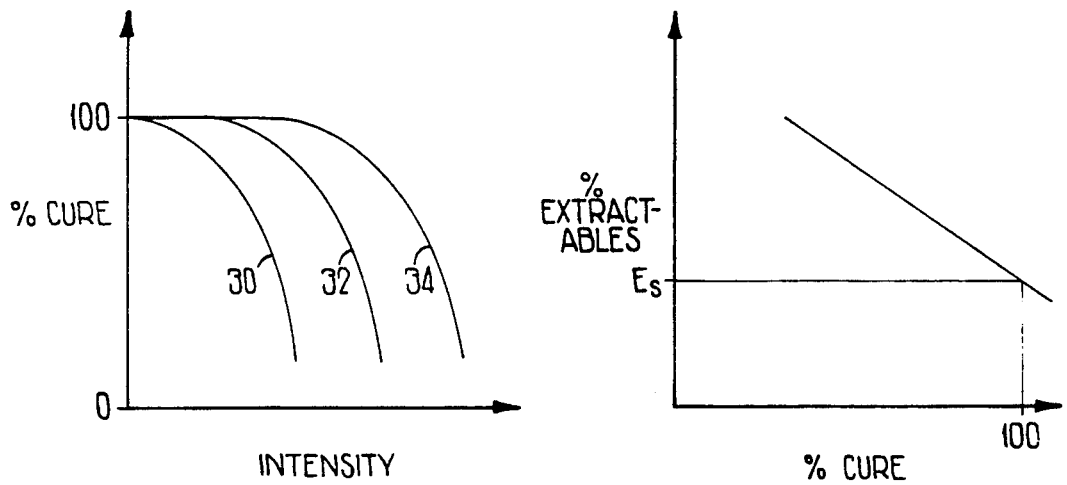
FIG 4
FIG 5

METHODS FOR REDUCING THE REACTIVITY OF ARTICLES DESTINED FOR DISPOSAL

TECHNICAL FIELD

This invention relates to methods of reducing the reactivity of articles destined for disposal. More particularly, the invention relates to methods of treating containers which include residues of ultraviolet light (UV) curable acrylate materials to reduce the reactivity of the containers and facilitate their disposal at significantly less cost than in the past.

BACKGROUND OF THE INVENTION

In the manufacture of optical glass fibers, it is commonplace to apply a coating system comprising one or more coating materials to optical fiber which is drawn from a vertically suspended preform. A typical coating material is a UV curable acrylate material. This coating material can be packaged in a variety of high density polyethylene (HDPE) plastic containers ranging in size from one (1) pint to fifty-five (55) gallons, more specifically in one (1) quart to thirty (30) gallons. After the coating material in a container has been consumed, disposal is provided for the container. As a result of typical handling procedures for optical fiber coating materials, a residual amount of coating material remains in the container that is slated for disposal.

In accordance with the Resource Conservation and Recovery Act, as amended by the Hazardous and Solid Waste Act of 1984, the environmental characteristics of this acrylate-based coating system cause it to be classified as a non-hazardous waste. However, the occupational health and safety aspects of handling this coating material must be considered. The potential for dermal exposure to the acrylate components of the coating material can be controlled in the workplace by providing personnel with suitable protective equipment, such as gloves, aprons, and goggles or glasses.

After the containers with the residual coating material are discarded, the task of protecting individuals who may come in contact with solid wastes which include these coating material containers becomes logistically difficult. Dermal exposure to these coatings can result in sensitization to some of the acrylate components. As a result, companies which handle these coating materials in the course of business must take appropriate measures to protect those who may encounter such discarded containers.

Historically, this problem has been overcome by the incineration of the container and any residual coating therein. Incineration of these coating materials thermally breaks down the acrylate components of the coating material into non-sensitizing constituents.

In another prior art treatment, such contaminated containers have been purged to remove any residual coating material therein. The residual coating material has been put into tubs which have been left in the sunlight to dry. The problem with such a procedure is that the radiance of the sun is daily and seasonally variable because of the relative positions of the sun and the container somewhere on earth. As a result, there is no reproducible radiation source which will assure consistently a complete cure of any residual coating material.

What is needed and what is not available in the prior art are methods for reducing the reactivity of an article having a contaminating composition of matter in engagement with at least a portion thereof and being destined for disposal. Such methods should be relatively inexpensive to implement, and, of course, should not present in and of themselves any additional environmental or occupational health problems.

SUMMARY OF THE INVENTION

The foregoing problems of the prior art have been overcome by the methods of this invention. In a method of preparing for disposal an article which includes a curable composition of matter in engagement with at least a portion thereof, the article being destined for disposal is supported. The composition of matter is exposed to suitable energy which is reproducible to cause the composition of matter to be cured completely. This reduces the reactivity of the article and facilitates its disposal at much less cost and at a much lower environmental risk level.

For typical UV curable optical fiber coating materials, the thrust of the invention is to utilize an ultraviolet light source either encased in a specially designed enclosure, or mounted on a portable wand, to cure the acrylate coating residue inside a container from which a liquid coating material has been withdrawn for use in a manufacturing process. Typically, withdrawal does not completely empty the container and residual coating material is present in the container which is destined for disposal. Treatment in accordance with this invention causes the residue to become fully cured and a somewhat integral part of the article.

Through the use of this invention, any container with a residual amount of a UV curable composition of matter, such as an acrylate-based coating system, for example, could be irradiated and be rendered substantially non-toxic to humans who undergo dermal exposure thereto.

This invention allows the disposal of contaminated containers by including them in a regular solid waste stream, without the need to take further preventive measures associated with human exposure to these materials. Furthermore, industrial handling of the not quite empty containers which have been treated in accordance with this invention to increase the stability of the containers having residual coating material therein does not require protective equipment. In addition to the cost savings associated with the inventive treatment, the practice of this invention also increases incineration capacity for commercial incinerators so that they could be used to dispose of more environmentally troublesome materials.

BRIEF DESCRIPTION OF THE DRAWING

Other features of the present invention will be more readily understood from the following detailed description of specific embodiments thereof when read in conjunction with the accompanying drawings, in which:

FIG. 2 is a graph which depicts the relationship for a UV curable material between percent cure and UV dose showing the critical dose, Dc, needed for 100% cure;

FIG. 3 is a graph which depicts the relationship between thickness of a UV curable material to be subjected to ultraviolet light energy and a critical dose of the UV energy;

FIG. 4 is a graph of a family of curves, each depicting the relationship between percent cure and intensity for a particular thickness of a UV curable material to be subjected to UV energy;

FIG. 5 is a graph which depicts percent extractables versus percent cure;

DETAILED DESCRIPTION

Figure 1:
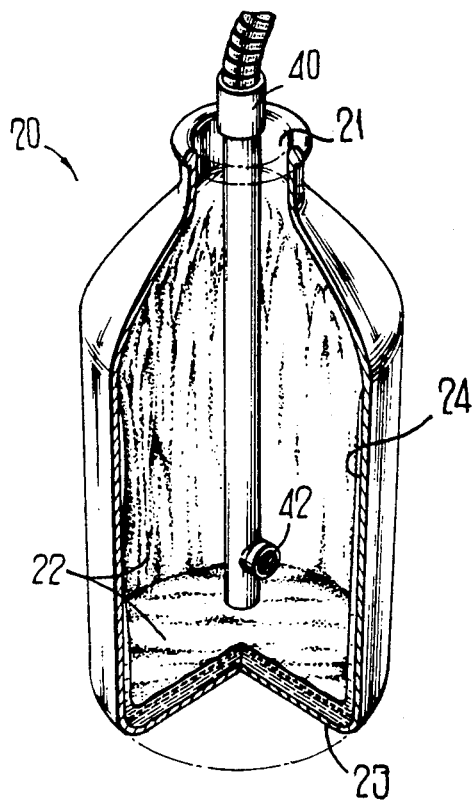
FIG. 1 depicts a container which is used to hold a coating material and a prior art energy source disposed at least partially in the container.

Referring now to FIG. 1, there is shown a container 20 which is used to hold a coating material 22 which is applied to optical fiber. The container 20 includes an opening 21, a bottom 23 and an inner sidewall 24. Typically, and as is well known, the coating material 22 is applied to optical fiber after the fiber has been drawn from a vertically suspended preform. See, for example, the disclosure of U.S. Pat. No. 4,409,263 which issued on Oct. 11, 1983 in the name of C. J. Aloisio, Jr.. The coating material 22 may be applied to optical fiber by a coating device such as that disclosed in U.S. Pat. No. 4,474,830 which issued on Oct. 2, 1984 in the name of C. R. Taylor.

Generally, each container 20 of the coating material is removed from use before all the coating material has been removed therefrom. Afterwards, the container 20 is discarded. In the coating of optical fiber, it has been commonplace to use a UV curable acrylate material. As discussed hereinbefore, containers including residues of such coating materials must be disposed in a particular manner such as by incineration in order to conform to environmental regulations.

The methods of this invention allow disposal of spent containers without the need for expensive procedures such as incineration. Simply stated, the methods of this invention are effective to reduce the reactivity of the containers which include residual coating material therein prior to their disposal.

UV curable compositions are converted from a liquid to a solid upon exposure to ultraviolet light. These compositions typically are multi-component mixtures which may include a high viscosity oligomer, diluents used to reduce viscosity, a photoinitiator, and additives, such as antioxidants or stabilizers.

As mentioned, the currently used material for optical fiber coatings, as well as for inks, and bonded ribbon matrix material is an acrylate based material. This class of materials is chosen primarily because of the inherent reactivity thereof, that is, the rapidity with which they are converted from a liquid phase to a solid phase. Upon exposure to UV light, the photoinitiator constituent forms two free radical reactive fragments which react with acrylate end-groups of the oligomer constituents and the diluents. This reaction produces a radical on the acrylate end-group which can further react with other acrylate end-groups. This chain reaction which is called free radical polymerization converts rapidly the liquid material to a solid material. The solid material is crosslinked through the acrylate end groups to form a three dimensional network.

Another UV curable chemistry used in industry today is an epoxy-based formulation. The composition of a UV curable epoxy system is similar to that of the acrylate-based material described above. The main compositional difference is that the acrylate end-groups are replaced with epoxy end-groups. The conversion of a UV curable epoxy liquid to a solid also involves a chain reaction. Upon absorption of light, the photoinitiator constituent generates a proton which reacts rapidly with an epoxy end-group on the oligimer or diluent. This reaction generates a cation which reacts further with epoxy end-groups on the diluent or oligomers to produce a three dimensional crosslinked network.

Currently in the optical fiber manufacturing industry, UV curable acrylate coating and matrix materials in liquid phase are supplied in high density polyethylene bottles. These bottles are used because they allow oxygen which is necessary to activate a viscosity shelf life stabilizer in the UV curable composition to permeate therethrough. In manufacture, the liquid material is decanted from the container 20 into a reservoir which supplies the coating material to a matrix material applicator such as that disclosed in the hereinbefore identified C. R. Taylor patent. After decanting, a finite amount of acrylate material in liquid phase remains in the container. The methods of this invention convert the liquid residue to a solid material to reduce the reactivity of the container and facilitate disposal thereof.

In accordance with the methods of this invention, containers 20-20 from which the UV curable material has been decanted are moved to a dedicated, segregated area or room. There, a workperson exposes the inner wall area of each container 20 to a sufficient amount of suitable UV energy at a suitable wavelength, thus converting all residual acrylate material to a relatively harmless solid. The workperson is provided with appropriate safety equipment such as protective gloves and coveralls, safety glasses, and a respirator which can filter out all organic vapors. In place of the respirator, adequate ventilation is provided to reduce the concentration of organic vapors to an acceptable safe level. After exposure to a sufficient amount of UV energy, the containers 20-20 are removed, shredded, and prepared for landfill disposal. The procedure may rely on robotics to irradiate the entire inner wall surface of the container 20. Although a segregated area is still required, worker exposure is minimized.

Coating materials currently in use in manufacture are characterized by a cure which is UV dose dependent (see FIG. 2). Total or complete cure, i.e. 100%, is achieved if a critical UV dose, i.e., Dc, is achieved or exceeded. Also, and as can be seen in FIG. 3, the cure of the coating materials used in optical fiber manufacture is thickness dependent. Further, the cure of the coating materials used in optical fiber manufacture is intensity dependent. This can be seen in FIG. 4, which depicts plots of a family of curves 30, 32 and 34, each showing, for a particular thickness coating material the relationship of percent cure to intensity. The curve 30 is associated with a thickness of 0.05 cm, the curve 32 with a thickness of 0.02 cm and the curve 34 with a thickness of 0.013 cm.

Upon storage, the container 20 from which the UV curable material has been decanted may remain open which would allow some constituents of the material to evaporate. Some of the constituents which evaporate may cause the material remaining to be non-curable. If the residual material found in the spent containers is non-curable, steps may be taken to render it reactive. Either a liquid photoinitiator or an additional amount of the original UV curable composition of matter may be added.

In order to provide apparatus for treating suitably the reside coating material, it must be remembered that the critical UV dose is thickness dependent. The maximum thickness expected to be encountered in containers 20-20 destined for disposal is determined and the ultraviolet light needed to cure the residual material therein is measured. An added complication is that the percent cure is intensity dependent. If the intensity is increased, skin cure only results. The less the thickness, the higher the intensity that can be tolerated. What is important is that the photochemistry of the residual coating materials must be considered in determining a successful treatment of these materials.

What is important is to achieve complete cure of the residual coating material 22. This may be controlled by determining the extractables as a function of 100% cure. FIG. 5 depicts the relationship between extractables in percent and percent cure. A container 20 which includes a cured residual coating material is ground into smaller portions, pelletized and extracted with a suitable organic solvent (Ecc). These are compared with pellets of a container not having a residue therein and being subjected to similar treatment (Ec). The result (Ecc-Ec) is a measure of extractables and should be equal to Es, which is equal to the percent extractables of sheets of the coating material 22 at 100% cure. Such a procedure verifies that the residual coating material of the container 20 treated in accordance with this invention has been cured completely.

Although the arrangement of FIG. 1 is usable for practicing the methods of this invention, there are problems associated therewith. First, a ten inch length wand 40 which has a single UV lamp 42 projecting laterally therefrom and which is commercially available is suitable for small containers, but not for larger ones. Further, inasmuch as a single lamp 42 of the commercially available wand 40 projects laterally therefrom, there is no direct radiation of the bottom and all portions of the inner sidewall of the container 20. As such, it is difficult for the single lamp 42 to be effective to cure the residual liquid coating material 22 on the inner sidewall and on the bottom of the container 20.

Figure 6:
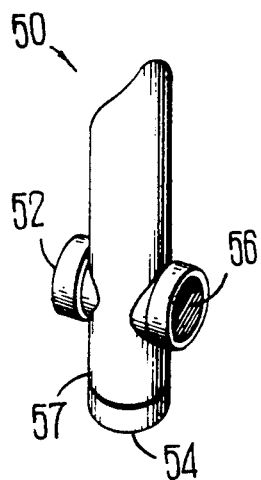
FIG. 6 is schematic view of a lamp arrangement which may be used to treat residual coating material inside a container.

In order to overcome this problem of the prior art energy wands, a wand 50 (see FIG. 6) of this invention may be extended to a length approximately in the range of four feet. Further, the wand 50 includes three lamps 52, 54 and 56. The lamp 54 is positioned at an end 57 of the wand 50 and each of the other two is directed laterally outwardly. Such a wand may be inserted into the deepest expected container 20, rotated and moved reciprocally to cure all the remaining liquid coating material in the container. Also as can be seen in FIG. 3, the thicker the residue, the more dose which is required. However, as mentioned hereinbefore, FIG. 4 also must be taken into consideration. This may require a fine tuning of intensity of the curing energy. From the population of the containers 20-20, the mean thickness of the residual material is determined and the critical dose determined corresponding to that mean plus three standard deviations.

Unlike the prior art techniques, the methods of this invention take into account the photochemistry depicted in FIGS. 2-4 in order to assure that only containers having fully cured coating materials therein are landfilled. As is seen in FIGS. 2-4, the quality of light is important in achieving the goal of 100% cure. Because in the past, basic photochemistry has been ignored, the curing of residue in containers has not been reproducible.

Figure 7:
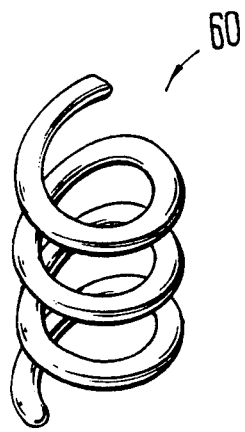
FIG. 7 is a schematic view of another lamp arrangement which may be used to treat the residue coating material inside a container.
Figure 8:
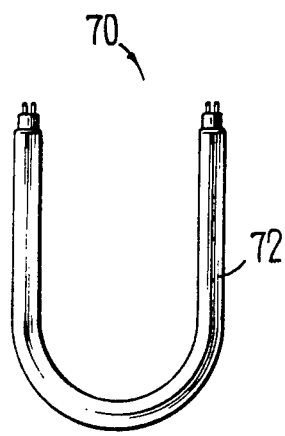
FIG. 8 is a schematic view of a U-shaped curing lamp.

Other configuration energy wands also may be used in order to avoid the need for rotation and/or reciprocal motion of the wand devices. One of these is helical in form, is designated by the numeral 60 (see FIG. 7), and has a suitable connection to a source of energy. Another arrangement 70 is shown in FIG. 8 and includes a lamp 72 having a U-shaped configuration attached to a wand (not shown). Although the U-shaped configuration need not be moved rotatably or reciprocally within a container 20, it is sensitive to handling by workpersons.

Figure 9:
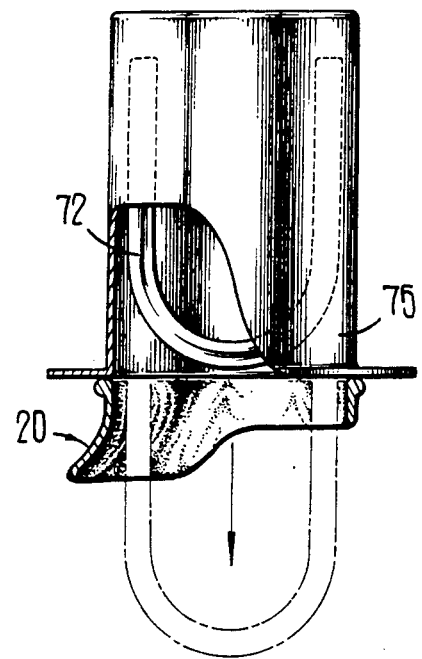
FIG. 9 is a schematic view of the U-shaped curing lamp of FIG. 8 disposed within a protective sheath.

In order to provide a less sensitive lamp arrangement, the lamp 72 of the arrangement of FIG. 8 may be provided with a sheath 75 (see FIG. 9) which may be made of a metallic material such as stainless steel. In use, the sheathed lamp is transported to the vicinity of a container 20. The lamp 72 is aligned with the container opening 21 and a mechanism (not shown) controlled to cause the closed end of the U-shaped lamp 72 to be moved into the container. The metallic sheath 75 is effective to enhance the handleability of the curing lamp 72. Suitable energy is supplied to the lamp 72 to cause any residual coating material in the container to be cured completely.

Figure 10:
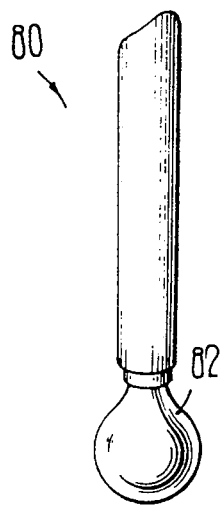
FIG. 10 is a schematic view of single lamp arrangement for curing residual material within a container.
Figure 11:
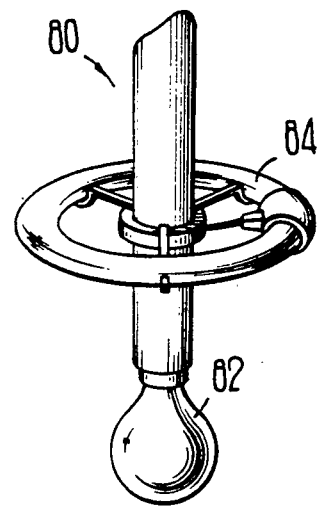
FIG. 11 is a schematic view of still another curing lamp arrangement.

A still further embodiment is shown in FIG. 10. In that figure is shown a wand 80 having a curing lamp 82 which extends from a lower portion thereof. Another embodiment of the wand 80 is shown in FIG. 11 where an annular lamp 84 is disposed about the wand spaced from the lamp 82.

Although the invention has been described in terms of curing a polymerizable liquid coating material before disposal, the invention is not so limited. The invention is directed to the curing or hardening of a liquid material by specific means to reduce its reactivity and facilitate disposal. In other words, any polymerizable liquid composition of matter before disposal is hardened by exposure to specific kinds of energy. Examples of materials which may be so treated prior to disposal include epoxy materials, both thermally and UV curable types, silanol and vinyl materials, methacrylates, vinyl ethers and acrylate derivatives.

Nor is this invention limited to the use of ultraviolet light to cure the residue material. Energy forms to which the liquid materials may be suitably exposed also include heat, ultrasound, electron beam radiation and gamma radiation. For example, electron beam energy is used in the manufacture of floppy discs, compact audio discs, video tape and audio tape. Thermal cure is used in the manufacture of composites in aircraft, automobile parts, bicycles, snow and water skis and for polyurethane enamels for automotive and aircraft applications.

Also, it should be apparent that this invention is not limited to treating residues of liquid coating materials which have been used to coat optical fiber. For example, UV curable materials are used in floor coverings, printing inks, furniture coverings, particle board, adhesives, printed wire circuit boards, and aircraft and automotive composites. In each instance, there may exist containers in which there are residues of the material.

It is to be understood that the above-described arrangements are simply illustrative of the invention. Other arrangements may be devised by those skilled in the art which will embody the principles of the invention and fall within the spirit and scope thereof.

We claim:

1. A method of preparing a container, at least a portion of which includes a curable composition of matter, for disposal, said method comprising the steps of:
   supporting a container which is destined for disposal and at least a portion of interior surfaces of which has a curable composition of matter in engagement therewith; and
   exposing the curable composition of matter within the container to suitable reproducible energy having an intensity level which is sufficient to cure completely the composition of matter and thereby reduce the reactivity of the container.

2. The method of claim 1, wherein said composition of matter is radiation curable.

3. The method of claim 2, wherein said composition of matter is ultraviolet light curable.

4. The method of claim 1, wherein said composition of matter is thermally curable.

5. The method of claim 1, wherein said container has an opening therein and said step of exposing includes the step of inserting a curing lamp into the opening of the container to cause the composition of matter to be exposed to curing energy.

6. The method of claim 5, wherein the curing lamp is caused to be rotated.

7. The method of claim 6, wherein the curing lamp is caused to be moved reciprocally.

8. The method of claim 5, wherein the curing lamp is protected from mechanical damage when the lamp is outside the container.

9. The method of claim 1, wherein the critical ultraviolet light dose is determined to provide 100% cure for a particular thickness residual curable composition of matter.

10. The method of claim 9, wherein the critical dose is determined in accordance with the largest expected thickness of residual curable composition of matter.

11. The method of claim 10, wherein the intensity of the curing energy is determined to cause the residual curable composition of matter to be cured completely notwithstanding its thickness.

* * * * *